United States Patent
Nishimura et al.

(10) Patent No.: US 7,840,201 B2
(45) Date of Patent: Nov. 23, 2010

(54) COMMUNICATION MODULE HAVING TUNER UNITS THAT ARE SEPARATED AND ISOLATED FROM EACH OTHER, AND METHOD OF MANUFACTURING THE SAME

(75) Inventors: Daisuke Nishimura, Osaka (JP); Hiroaki Ozeki, Osaka (JP); Takeshi Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 996 days.

(21) Appl. No.: 11/629,349

(22) PCT Filed: Jun. 8, 2006

(86) PCT No.: PCT/JP2006/311506

§ 371 (c)(1),
(2), (4) Date: Dec. 12, 2006

(87) PCT Pub. No.: WO2006/132312

PCT Pub. Date: Dec. 14, 2006

(65) Prior Publication Data

US 2009/0011726 A1 Jan. 8, 2009

(30) Foreign Application Priority Data

Jun. 9, 2005 (JP) ............................. 2005-169148

(51) Int. Cl.
*H04B 1/18* (2006.01)
*H05K 1/11* (2006.01)

(52) U.S. Cl. ...................................... 455/189.1; 334/85

(58) Field of Classification Search ............. 455/189.1, 455/190.1, 258, 296, 300, 301, 313; 334/85; 361/728, 730, 748, 752, 753, 761, 764
See application file for complete search history.

(56) References Cited

U.S. PATENT DOCUMENTS

| 4,920,455 | A | * | 4/1990 | Maier et al. .................. 361/814 |
| 6,737,945 | B2 | * | 5/2004 | Kawai .......................... 334/85 |
| 7,030,938 | B2 | * | 4/2006 | Kawakami .................... 348/731 |
| 7,634,225 | B2 | * | 12/2009 | Kawakami et al. ......... 455/3.02 |
| 2003/0007450 | A1 | | 1/2003 | Ohtaki | |

FOREIGN PATENT DOCUMENTS

| JP | 5-13098 | 2/1993 |
| JP | 11-317687 | 11/1999 |
| JP | 11-341374 | 12/1999 |
| JP | 2003-018123 | 1/2003 |

* cited by examiner

*Primary Examiner*—Blane J Jackson
(74) *Attorney, Agent, or Firm*—Wenderoth, Lind & Ponack, LLP.

(57) ABSTRACT

A communication module is provided in which its characteristic of separation between its first and second tuner units is improved. The module is equipped with a circuit board having a first main surface, and a second main surface opposite to the first main surface; a first amplifier arranged on the first main surface, for amplifying a first signal; a first mixer arranged on the first main surface, for converting a signal supplied from the first amplifier to an intermediate-frequency signal; a second amplifier for amplifying a second signal; and a mixer for converting a signal supplied from the second amplifier to an intermediate-frequency signal, both arranged on the second main surface of the circuit board.

9 Claims, 12 Drawing Sheets

(Terminal 35a)

US 7,840,201 B2

COMMUNICATION MODULE HAVING TUNER UNITS THAT ARE SEPARATED AND ISOLATED FROM EACH OTHER, AND METHOD OF MANUFACTURING THE SAME

TECHNICAL FIELD

The present invention relates to a communication module incorporating two tuners and to a method of manufacturing the module.

BACKGROUND ART

FIG. 24 illustrates an example of a conventional communication module incorporating two tuners. In FIG. 24, the communication module is equipped with one circuit board 1 with a substantially quadrangle shape, and on the first main surface of which first tuner unit 2a, and second tuner unit 2b and demodulating unit 3 are implemented respectively.

One first vertical side 1a of circuit board 1 is provided thereon with first terminal 5a to which first antenna 4a is connected and second terminal 5b to which second antenna 4b is connected, respectively.

First tuner unit 2a includes first filter 6a connected to first terminal 5a, for processing high-frequency signals; first amplifier 7a connected to the output terminal of first filter 6a, for amplifying high-frequency signals; and first mixer 9a having a first input terminal to which the output terminal of first amplifier 7a is connected and a second input terminal to which the output terminal of local oscillator 8a is connected. First tuner unit 2a includes intermediate-frequency filter 10a connected to the output terminal of first mixer 9a; and intermediate-frequency amplifier 11a connected to the output terminal of intermediate-frequency filter 10a. The output terminal of intermediate-frequency amplifier 11a is connected to first terminal 12a of electronic switch 12.

Second tuner unit 2b includes second filter 6b connected to second terminal 5b, for processing high-frequency signals; second amplifier 7b connected to the output terminal of second filter 6b, for amplifying high-frequency signals; and second mixer 9b to which first input terminal the output terminal of second amplifier 7b is connected and to which second input terminal the output terminal of local oscillator 8b is connected. Second tuner unit 2b includes intermediate-frequency filter 10b connected to the output terminal of second mixer 9b; and intermediate-frequency amplifier 11b connected to the output terminal of intermediate-frequency filter 10b. The output terminal of intermediate-frequency amplifier 11b is connected to second terminal 12b of electronic switch 12.

Common terminal 12c of electronic switch 12 is connected to output terminal 13 through demodulating unit 3. In the communication module formed as described above, first terminal 5a and second terminal 5b are supplied with a first signal and a second signal for television broadcasting respectively, for example. In order to receive the first and second signals with high fidelity, demodulating unit 3 compares output from first tuner unit 2a with that from second tuner unit 2b and chooses tuner unit 2a or tuner unit 2b, whichever is more sensitive, with electronic switch 12. This always enables reception with high sensitivity.

As prior art documents related to this patent application, Japanese Patent Unexamined Publication No. 2003-18123 is known, for example.

In such a conventional communication module, first tuner unit 2a and second tuner unit 2b are implemented on common circuit board 1. This causes high-frequency separation and isolation between first tuner unit 2a and second tuner unit 2b to be inadequate. In particular, the following problem occurs. That is, a feeble reception signal from first terminal 5a is amplified to increase its signal energy during the period after the first signal is amplified by first amplifier 7a until the signal is converted to an intermediate-frequency signal (low-frequency signal) by first mixer 9a. Accordingly, the first signal is mixed into second tuner unit 5b to interfere with the second signal.

Meanwhile, a feeble reception signal from second mixer 9b is amplified to increase the signal energy during the period after the second signal is amplified by second amplifier 7b until the signal is converted to an intermediate-frequency signal (low-frequency signal) by second mixer 9b. Accordingly, the second signal is undesirably mixed into first tuner unit 5a to interfere with favorable reception.

SUMMARY OF THE INVENTION

The present invention provides a communication module that reproduces input signals with high fidelity by separating and isolating the first and second tuner units from each other in high frequencies.

A communication module of the present invention is equipped with a circuit board having a first main surface, and a second main surface opposite to the first main surface. The communication module further includes a first amplifier arranged on the first main surface of the circuit board, for amplifying a first signal; a first mixer arranged on the first main surface, for converting an input signal supplied from the first amplifier to an intermediate-frequency signal; a second amplifier arranged on the second main surface of the circuit board, for amplifying a second signal; and a second mixer arranged on the second main surface, for converting a signal supplied from the second amplifier to an intermediate-frequency signal.

The makeup described above causes the circuit board to intervene between the first tuner unit including the first amplifier and first mixer, and the second tuner unit including the second amplifier and second mixer, resulting in the two tuners separated and isolated in high frequencies. Consequently, the first and second tuner units do not electrically interfere with each other and reproduce various types of signals independently of each other.

Meanwhile, the second tuner unit is arranged on the second main surface of the circuit board, identical to that with the first tuner unit arranged thereon, thus enabling the communication module to be downsized compared to a conventional one.

DETAILED DESCRIPTION OF PREFERRED EMBODIMENTS

Hereinafter, some embodiments of the present invention are described with reference to the related drawings.

First Exemplary Embodiment

Figure 1:
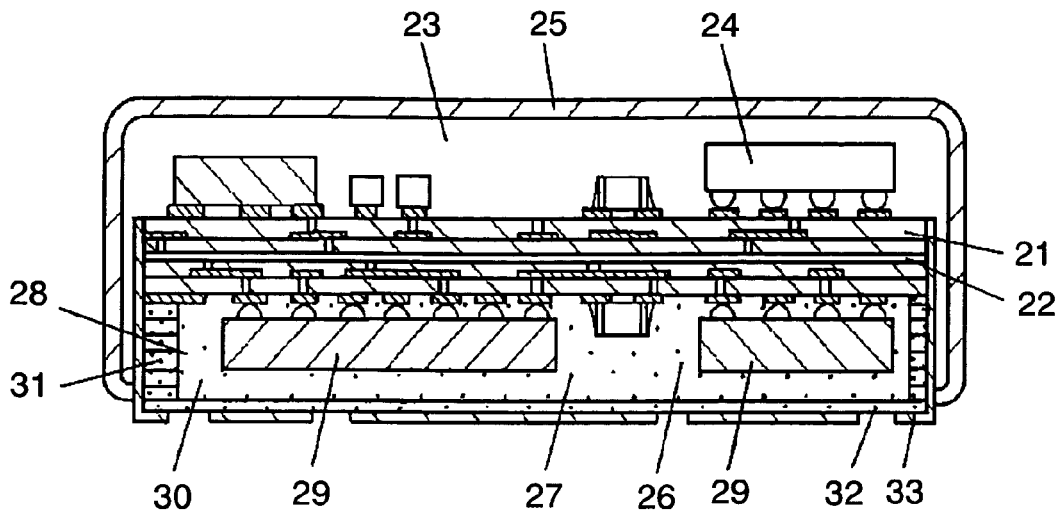
FIG. 1 is a sectional view of a communication module according to the first exemplary embodiment of the present invention.

FIG. 1 is a sectional view of a communication module according to the first exemplary embodiment of the present invention. In FIG. 1, circuit board 21, which is shaped substantially as a quadrangle, is formed with glass base material and epoxy resin, for example, and has a multilayered structure thermally hardened. The upper and lower layers of circuit board 21 with a multilayered structure are connected through an inner via. At least one of the first and second main surfaces of each layer of circuit board 21 has a copper foil pattern laid thereon to form various types of circuits. Here, at least one of the layers in the multilayer has ground plane 22 made of copper foil, connected to the ground potential. Ground plane 22 provides two functions: separates and isolates in high frequencies the circuits each provided separately on the first and second main surfaces of circuit board 21; and maintains circuit board 21 at the ground potential reliably.

The first main surface of circuit board 21 is provided thereon with first tuner unit 23. First tuner unit 23 has electronic components 24 such as an integrated circuit, transistor, diode, chip resistor, chip capacitor, and chip inductor, attached on the land pattern formed on circuit board 21, with solder for example. Further, shielded case 25 made of metal is provided so as to cover electronic components 24 and other electronic components that are not illustrated.

Meanwhile, the second main surface, opposite to the first main surface of circuit board 21, is provided with demodulating unit 27 composed of second tuner unit 26 and integrated circuits. Demodulating unit 27 has electronic components 29 and others attached to the land pattern formed on circuit board 21 with solder for example.

Electronic components 29 are covered with resin part 30, and the outer circumference of all electronic components 29 is enclosed by base-material-containing resin part 31. Resin part 30 protects electronic components 29 composing second tuner unit 26. Resin part 30 and base-material-containing resin part 31 form component-containing material 28. The outer side of component-containing material 28, namely the side opposite to circuit board 21, has bottom surface 32 of the communication module formed thereon. Bottom surface 32 has a ground electrode (not illustrated) and electrode 33 made of copper foil, formed thereon. Electrode 33 is connected to tuner unit 23, tuner unit 26, and demodulating unit 27, with a through hole. Electrode 33 provided on bottom surface 32 allows the communication module to be used as a surface-mounting component.

In the communication module according to the first exemplary embodiment, first tuner unit 23, and second tuner unit 26 and demodulating unit 27 are formed on the first and second main surfaces, respectively, sandwiching circuit board 21. First tuner unit 23, and second tuner unit 26 and demodulating unit 27 are separated as a result of the circuit board 21 intervening between them. Consequently, the first and second tuner units are separated and isolated in high frequencies, and thus do not interfere with each other, to reproduce signals with high fidelity.

Meanwhile, the second main surface of circuit board 21 forming first tuner unit 23 has second tuner unit 26 and demodulating unit 27 formed thereon, allowing the communication module to be downsized. Still, the second main surface of circuit board 21 is provided thereon with an integrated circuit forming demodulating unit 27, and thus the first main surface of circuit board 21 provides a sufficient space for arranging adjusting parts such as an inductor.

Additionally, component-containing material 28 is formed with resin part 30 covering electronic components 29 and base-material-containing resin part 31 surrounding the outer circumference of electronic components 29, and electronic components 29 are filled with sufficient resin without forming any clearance, preventing air or the like from entering a clearance. This prevents poor connection between electronic components due to thermal expansion of remaining air.

Inspection can be made for second tuner unit 26 and demodulating unit 27 while electronic components 29 are attached to circuit board 21, thus improving the yield rate after the completion of communication modules.

First tuner unit 23 is covered with metal shielded case 25 and is adequately shielded, and thus is separated and isolated in high frequencies from the outside. This prevents noise from entering from the outside and a high-frequency component from leaking to the outside.

The first main surface of circuit board 21 has an inductor for forming the local oscillator of tuner unit 23 formed thereon with a conductor pattern. Consequently, the inductance can be adjusted with relative ease by cutting the conductor pattern with laser light or the like. Here, the following arrangement may be made. That is, the major part of the conductor pattern forming the inductor is formed in the inner layer of circuit board 21, and the remaining part is formed on the surface (i.e. first main surface) of circuit board 21 after being led through an inner via, and then they are adjusted for a proper inductance. This way can reduce the area of the conductor pattern for the inductor occupying the surface of circuit board 21. Here, an inductor for forming the local oscillator may be implemented in an integrated circuit. This reduces the area of the module.

Components requiring their shape and size to be changed, such as a resistor, are attached on the surface of circuit board 21 as well. This allows the components to be changed easily.

The solder uses environmentally conscious, lead-free solder based on tin, silver, or copper. Here, instead of solder, a conductive adhesive with a thermosetting property can be used. Using a conductive adhesive, with a higher melting temperature than solder, prevents electronic components 29 from undesirably being detached from circuit board 21, even if soldering is performed at a high temperature near a position where the conductive adhesive is used.

The connecting method employs a reflow method for soldering. This is for high-quality soldering. This reflow soldering enables the reflow-soldered electronic components to be secured at a given position owing to a self-alignment effect. This allows the line length of the wiring pattern connecting one electronic component to another to remain constant, and so does the line inductance of the wiring pattern, thus bringing about desired electrical performance, which is particularly important in a high-frequency circuit. Further details about component-containing material 28 are described later using FIGS. 13 through 15.

Figure 2:
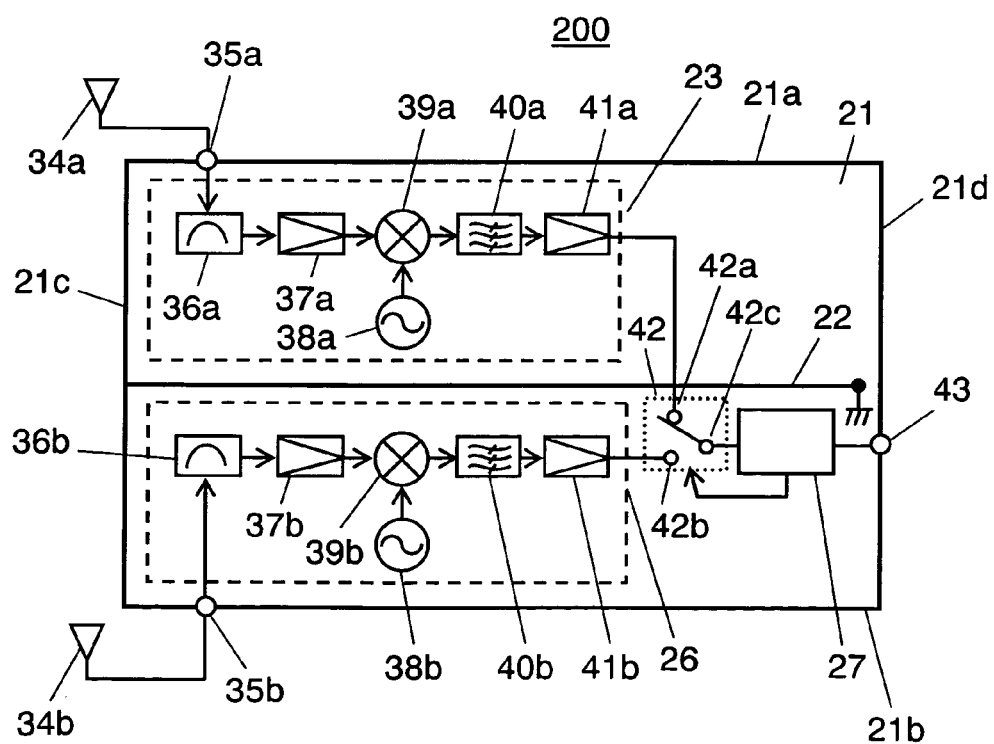
FIG. 2 is a block diagram of the communication module according to the first exemplary embodiment.

FIG. 2 is a block diagram of communication module 200. In FIG. 2, the first main surface, which has a substantially quadrangle shape, of circuit board 21 has first tuner unit 23 implemented thereon. The second main surface has second tuner unit 26 and demodulating unit 27 implemented thereon through ground plain 22 formed in the layer of circuit board 21.

Lateral side 21a, one side at the first main surface, is provided thereon with first terminal 35a to which first antenna 34a is connected, where first terminal 35a is connected to an electrode (not illustrated) formed on one lateral side of bottom surface 32 of the communication module with a through hole.

Meanwhile, lateral side 21b, the other side at the second main surface, namely the lateral side opposite to the other, viewing through from the first main surface, is provided thereon with second terminal 35b to which second antenna 34b is connected. Second terminal 35b is connected to an electrode (not illustrated) formed on the other lateral side of bottom surface 32 of the communication module with a through hole.

First tuner unit 23 includes first filter 36a connected to first terminal 35a, for processing high-frequency signals; first amplifier 37a connected to the output of first filter 36a, for amplifying high-frequency signals; and first mixer 39a having first input terminal to which the output terminal of first amplifier 37 is connected, and having a second input terminal to which the output terminal of local oscillator 38a is connected.

Here, first amplifier 37a amplifies a first signal from first filter 36a. First mixer 39a converts the signal supplied from first amplifier 37a to an intermediate-frequency signal. First tuner unit 23 includes intermediate-frequency filter 40a connected to the output of first mixer 39a; and intermediate-frequency amplifier 41a connected to the output of intermediate-frequency filter 40a. The output of intermediate-frequency amplifier 41a is led to the second main surface through a through hole (or via hole) formed in circuit board 21 and is connected to first terminal 42a of electronic switch 42 formed at the second main surface. Here, other electronic circuits such as a frequency mixer for increasing frequencies may exist between first amplifier 37a and first mixer 39a.

The circuit composing first tuner unit 23 is formed with a wiring pattern formed on circuit board 21; and electronic component 24. The ground of local oscillator 38a is provided near shielded case 25 and is connected directly to the side of shielded case 25 with a wiring pattern.

Second tuner unit 26 is composed of second filter 36b connected to second terminal 35b, for processing high-frequency signals; second amplifier 37b connected to the output of second filter 36b, for amplifying high-frequency signals; second mixer 39b having a first input terminal to which the output of second amplifier 37b is connected, and having a second input terminal to which the output terminal of local oscillator 38b is connected; intermediate-frequency filter 40b connected to the output of second mixer 39b; and intermediate-frequency amplifier 41b connected to the output of intermediate-frequency filter 40b. The output terminal of intermediate-frequency amplifier 41b is connected to second terminal 42b of electronic switch 42. Here, second amplifier 37b amplifies a second signal supplied from second filter 36b. Second mixer 39b converts a signal supplied from second amplifier 37b to an intermediate-frequency signal. Here, other electronic circuits such as a frequency mixer for increasing frequencies may exist between second amplifier 37b and second mixer 39b.

Common terminal 42c of electronic switch 42 is connected to demodulating unit 27, and demodulating unit 27 is connected to output terminal 43. Output terminal 43 is connected to an electrode (not illustrated) formed on bottom surface 32 of the communication module through a through hole provided in component-containing material 28.

The circuit composing second tuner unit 26 and demodulating unit 27 is formed with circuit patterns with various types of shapes formed on circuit board 21; and electronic components 29. As shown in FIG. 2, second filter 36b, second amplifier 37b, second mixer 39b, intermediate-frequency filter 40b, and intermediate-frequency amplifier 41b are arranged in this order from vertical side 21c, one side adjacent to second terminal 35b of circuit board 21, toward vertical side 21d, the other side. The ground of local oscillator 38b is provided near the support of shielded case 25 and connected directly to shielded case 25 with a wiring pattern.

Next, a description is made for operation of the communication module with the above-described makeup. The communication module according to the present invention is used for a mobile device and the like, ideal for receiving television broadcast waves (VHF, UHF), digital broadcast waves, digital communication waves, and others with higher sensitivity.

That is, communication module 200 selects a desired broadcast wave out of the supplied television broadcast waves, and chooses tuner unit 23 or tuner unit 26, whichever is more sensitive, out of the signals for the desired broadcast wave supplied from demodulator 27, with electronic switch 42. This always enables reception with high sensitivity. With such makeup, what is called switching diversity, one of antenna 34a and antenna 34b, whichever has higher reception sensitivity, is always chosen to receive a broadcast wave with high reception sensitivity, even if the communication module is moving. In the first exemplary embodiment, switching diversity is taken as an example. However, combining diversity may be used. This method further reduces the influence of the fluctuation in the reception signal level due to phasing, thus further improving reception performance during high-speed movement.

The first exemplary embodiment proves that circuit board 21 intervening between tuner unit 23 and tuner unit 26 has improved the separation and isolation characteristic between tuner unit 23 and tuner unit 26 by approximately 35 dB compared to a conventional one. Specifically, the circuits from first amplifier 37a to first mixer 39a, where a feeble reception signal supplied from first terminal 35a and second terminal 35b is amplified to increase its signal energy; and the circuits from second amplifier 37b to second mixer 39b are to be separated physically and electrically by circuit board 21. Still, ground plane 22 provided in the inner layer of circuit board 21 further improves the degree of separation and isolation by approximately 30 dB. Further, as a result of first terminal 35a and second terminal 35b being arranged on one lateral side and the other lateral side, respectively, the degree of separation and isolation has been improved by approximately 34.4 dB compared to a conventional one. The improvement of the degree of separation and isolation prevents interference, to allow receiving broadcast waves with high fidelity.

In the first exemplary embodiment, the power supply units of local oscillators 38a, 38b may be separately provided to be operated simultaneously with electronic switch 42. This reduces high-frequency interference and power consumption.

First amplifier 37a, local oscillator 38a, first mixer 39a, and intermediate-frequency amplifier 41a, all composing tuner unit 23 are implemented in a single integrated circuit. Second amplifier 37b, local oscillator 38b, second mixer 39b, and intermediate-frequency amplifier 41b, all composing tuner unit 26 are implemented in a single integrated circuit as well. Demodulating unit 27 is also implemented in a single integrated circuit. Local oscillators 38a, 38b do not need to be provided separately, but either of them can be used for commoditization.

In the first exemplary embodiment, second filter 36b is covered with resin part 30 on the second main surface of circuit board 21, but may be arranged on the first main surface of circuit board 21. If second filter 36b is covered with resin part 30, the capacitance at second filter 36b changes due to resin part 30. Consequently, the frequency band of a signal filtered by second filter 36b undesirably changes. To prevent such a defect, second filter 36b is arranged on the first main surface of circuit board 21, which is the outside of resin part 30.

Figure 3:
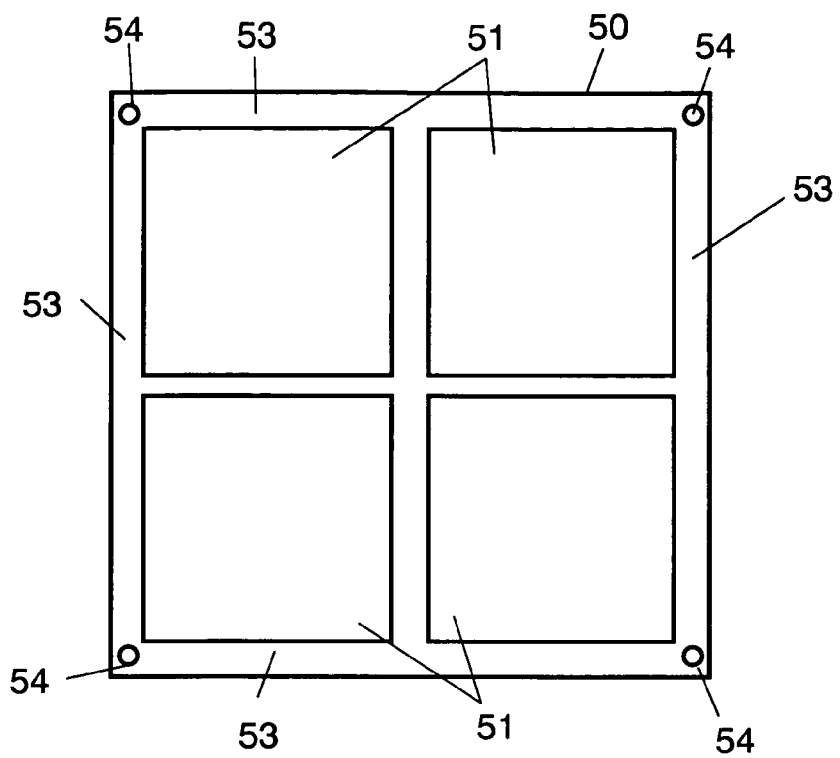
FIG. 3 is a plan view of the main board composing the communication module according to the first exemplary embodiment.

FIG. 3 is a plan view of a laminated circuit board used for manufacturing a communication module. Holes 54 for positioning are provided near the four corners of worksheet-like main board 50 thermally hardened. The peripheries of sub board 51 are linked with frame 53.

Figure 4:
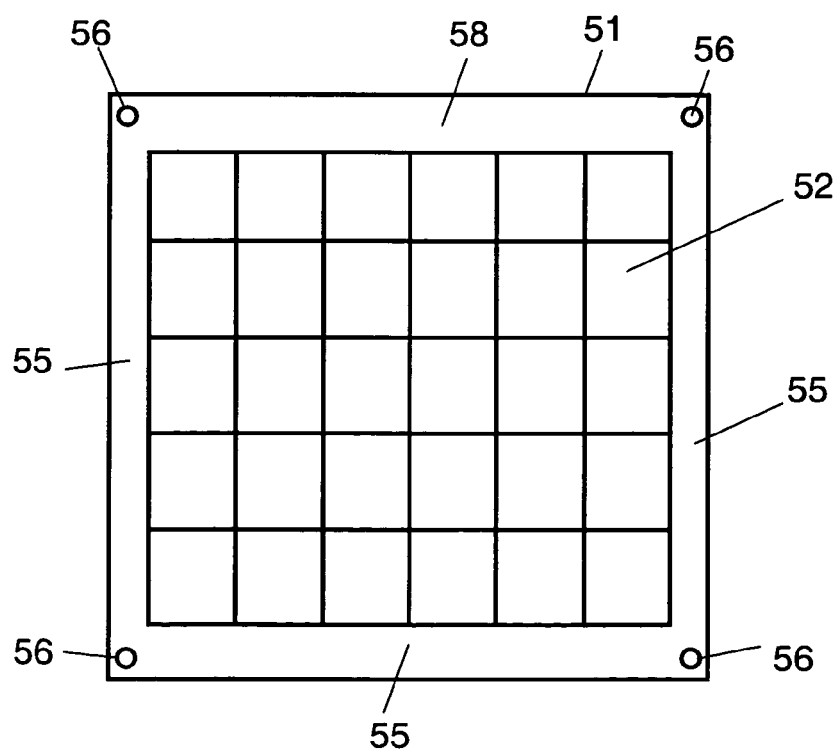
FIG. 4 is a plan view of a sub board composing the communication module according to the first exemplary embodiment.

FIG. 4 is a plan view of sub board 51. Sub boards 51 are arranged in 5 pieces in row by 6 pieces in column, forming an aggregate of 30 sub-sub boards 52 in total, for example. The peripheries of sub-sub board 52 are linked with frame 55. Holes 56 for positioning are provided near the four corners of sub board 51. Sub-sub boards 52 are implemented in circuit board 21 shown in FIG. 2.

Figure 5:
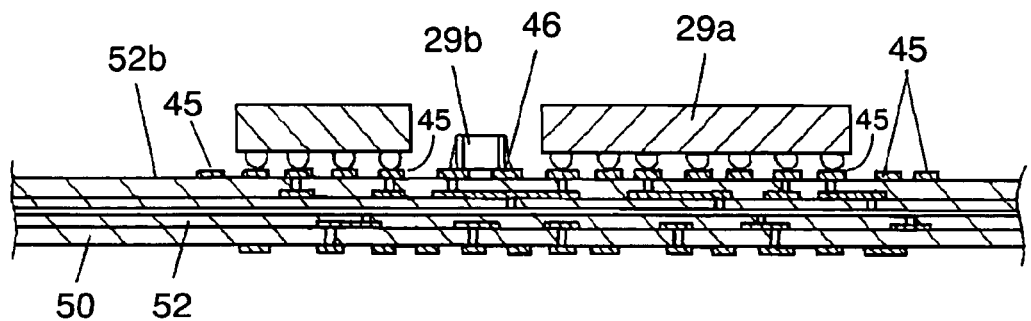
FIG. 5 is a sectional view illustrating the first step of the process for manufacturing the communication module according to the first exemplary embodiment.

FIGS. 5 through 12 illustrate respective steps of the method of manufacturing a communication module according to the present invention. FIG. 5 illustrates the first step, where main board 50 and sub-sub board 52 are shown. Integrated circuit 29a (an example of electronic component 29) incorporating second tuner unit 26 and demodulating unit 27, and resistor 29b (an example of electronic component 29) are attached with solder 46 to land pattern 45 provided on second main surface 52b of sub-sub board 52.

Figure 6:
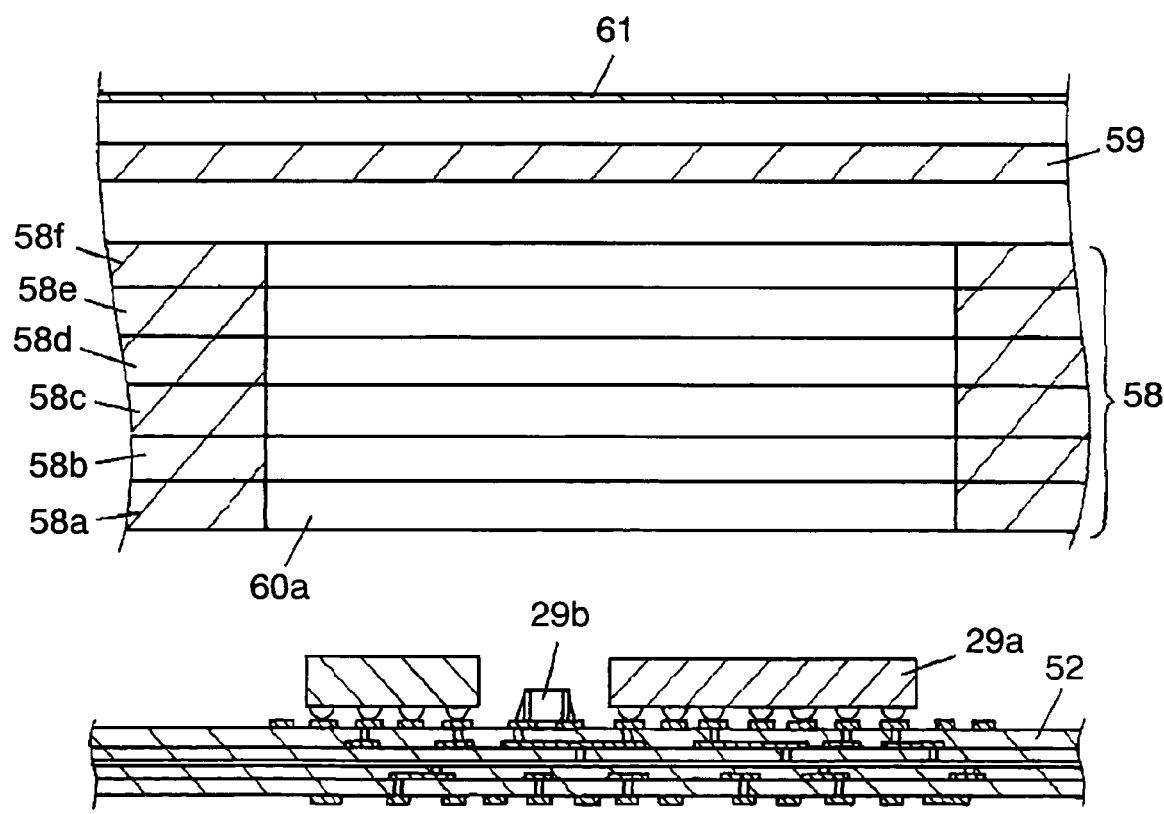
FIG. 6 is a sectional view illustrating the second step of the process for manufacturing the communication module according to the first exemplary embodiment.

FIG. 6 illustrates the second step of the method of manufacturing the communication module. FIG. 6 shows unhardened sheets 58, 59, each having a thermosetting property, before they are thermally hardened. Unhardened sheet 58 is provided thereon with integrated circuit 29a composing tuner unit 26 and demodulating unit 27, and hole 60a into which resistor 29b is inserted. Unhardened sheet 58 is formed by laminating six thin-layer sheets: sheets 58a through 58f, for example. The upper side of unhardened sheet 58 has unhardened sheet 59 without an opening and copper foil 61 laminated in this order, and these are integrated to form a component-containing sheet as shown in FIG. 7.

Figure 7:
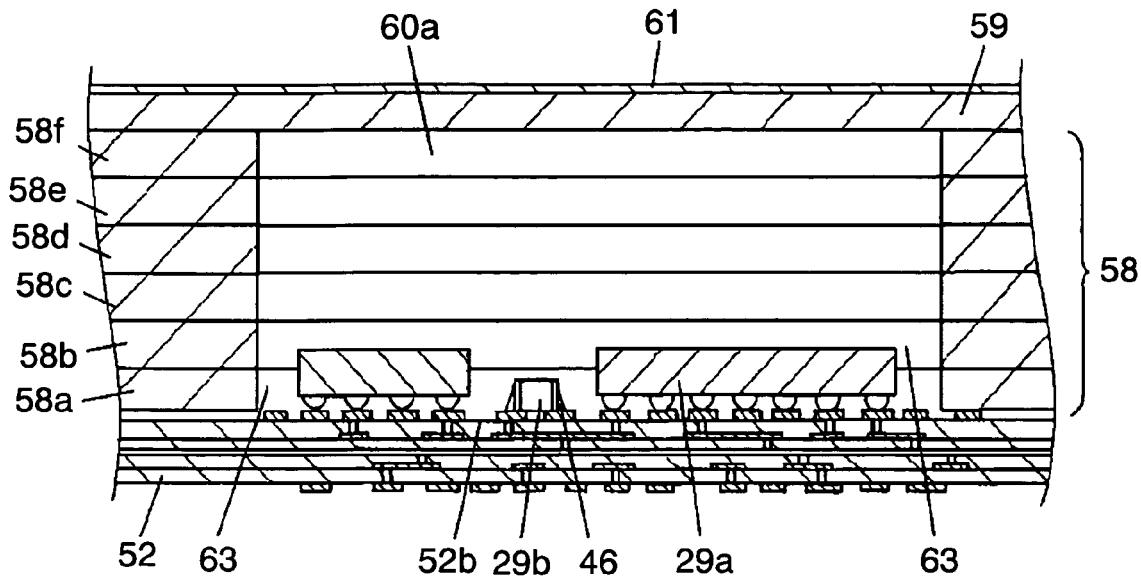
FIG. 7 is a sectional view illustrating the third step of the process for manufacturing the communication module according to the first exemplary embodiment.
Figure 8:
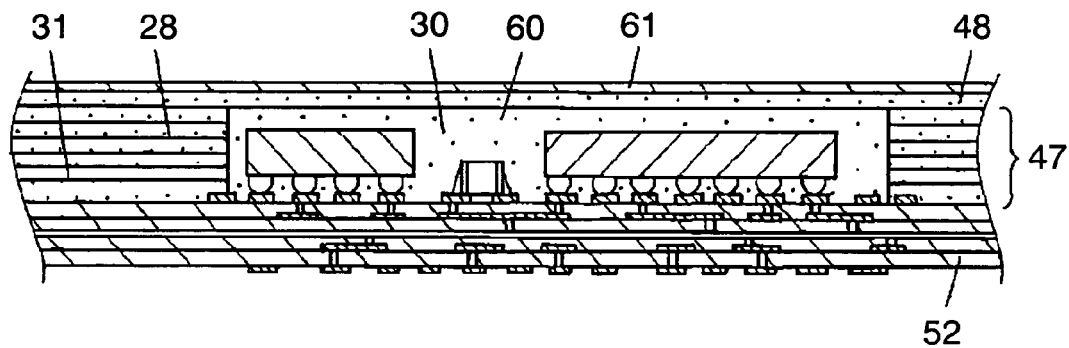
FIG. 8 is a sectional view illustrating the fourth step of the process for manufacturing the communication module according to the first exemplary embodiment.

FIG. 7 illustrates the third step of the method of manufacturing the communication module. Laminated unhardened sheets 58, 59 and copper foil 61 are placed on the side at tuner unit 26 and demodulating unit 27 provided on second main surface 52b of sub-sub board 52. Here, clearance 63 is provided between hole 60a and integrated circuit 29a. Clearance 63 becomes resin part 30 when heated as shown in FIG. 8 to be described later. This allows unhardened sheets 58, 59 to be easily inserted into sub-sub board 52 with integrated circuit 29a and resistor 29b attached thereon and to be laminated.

Next, a description is made for lamination of unhardened sheet 58. In FIG. 7, six unhardened sheets 58a through 58f on second main surface 52b of sub-sub board 52 are exemplified for convenience and simplification in the drawing. However, the number of unhardened sheets 58 is not limited; some other laminated circuit boards according to the present invention have 11 unhardened sheets 58 laminated.

Meanwhile, unhardened sheets 58a through 58f have hole 60a formed into which integrated circuit 29a and resistor 29b are inserted. The top surface of unhardened sheet 58f have unhardened sheet 59 and copper foil 61 laminated. Here, a metal reinforcing plate may be inserted between unhardened sheet 58f and unhardened sheet 59, to prevent warpage of the communication module after thermocompression bonding.

FIG. 8 illustrates the fourth step of the method of manufacturing the communication module. Unhardened sheets 58, 59 and copper foil 61 are thermocompressed and bonded at a low enough temperature for solder 46 to remain unmelted and integrated as shown in FIG. 8. The following conditions for thermocompression bonding in the first exemplary embodiment provide a favorable result. That is, the heating temperature is 180° C. to 200° C., the welding force is approximately 30 kg/cm$^2$, and the welding time is approximately 1 hour. This thermocompression bonding is performed in a vacuum chamber, which is important for purging air from hole 60a adequately and for filling the clearance between hole 60a and electronic component 29 with resin adequately. As a result of resin being thus injected adequately, air between hole 60*a* and electronic component 29 is completely purged.

This thermocompression bonding causes the resin in the unhardened sheet to flow out, changing unhardened sheet 58 to hardened sheet 47; and unhardened sheet 59 to hardened sheet 48, to form base-material-containing resin part 31. The resin that has flowed out then flows into hole (or recess) 60 formed from hole 60*a* by thermocompression bonding and fills hole 60, to form resin part 30. A detailed description is made using FIGS. 13 through 15 to be discussed later. Resin part 30 and base-material-containing resin part 31 compose component-containing material 28.

Figure 9:
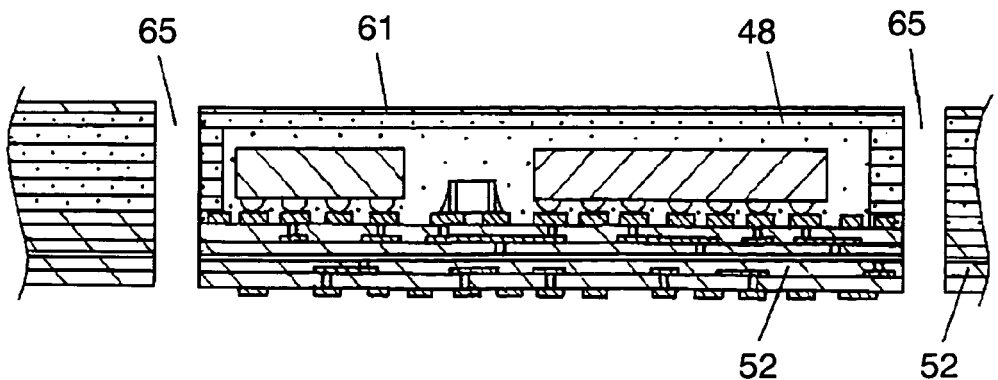
FIG. 9 is a sectional view illustrating the fifth step of the process for manufacturing the communication module according to the first exemplary embodiment.
Figure 10:
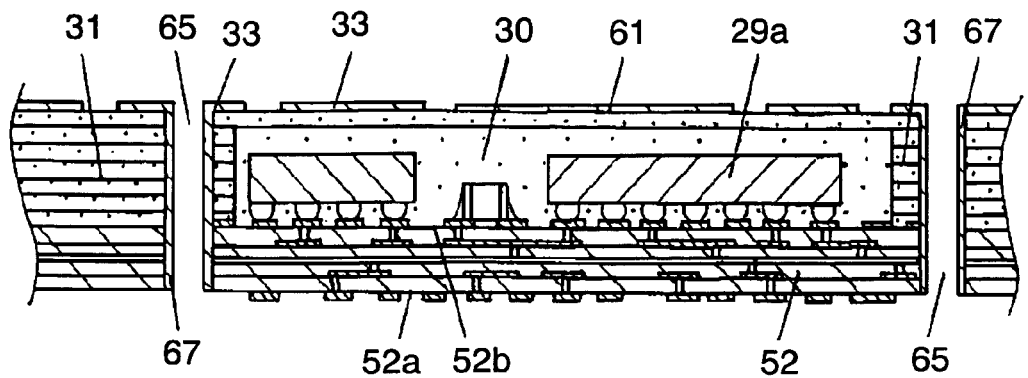
FIG. 10 is a sectional view illustrating the sixth step of the process for manufacturing the communication module according to the first exemplary embodiment.

FIG. 9 illustrates the fifth step of the method of manufacturing the communication module. As shown in FIG. 9, sub-sub board 52 and another adjacent one are provided therebetween with hole 65. Then, as shown in FIG. 10, copper foil 61 is etched into a given pattern to form electrode 33. Electrode 33 is connected to tuner unit 23 provided on first main surface 52*a* of sub-sub board 52, tuner unit 26 provided on second main surface 52*b*, and demodulating unit 27 through through hole 67. Through hole 67 is provided in the side of sub-sub board 52 and base-material-containing resin part 31 in the first exemplary embodiment. However, hole 67 may be provided near integrated circuit 29*a*, for example.

Figure 11:
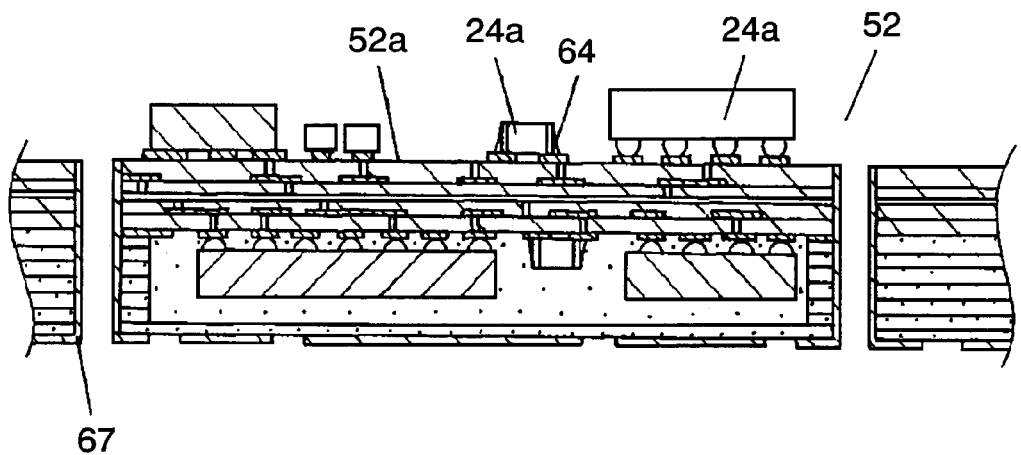
FIG. 11 is a sectional view illustrating the seventh step of the process for manufacturing the communication module according to the first exemplary embodiment.

FIG. 11 illustrates the seventh step of the process of manufacturing the communication module. Integrated circuit 24*a* and resistor 24*b* composing tuner unit 23 are attached with solder 64 on first main surface 52*a* of sub-sub board 52 having been turned upside down.

Figure 12:
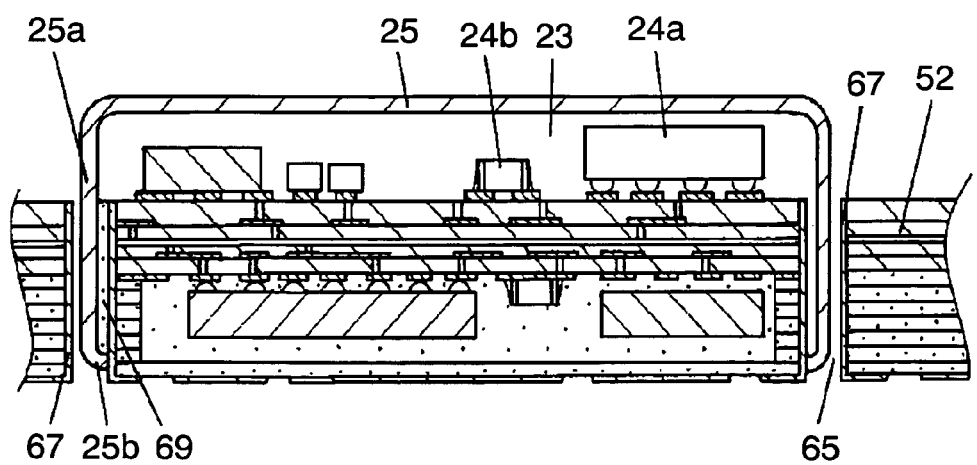
FIG. 12 is a sectional view illustrating the eighth step of the process for manufacturing the communication module according to the first exemplary embodiment.

Next, as shown in FIG. 12, shielded case 25 is attached so as to cover the side at tuner unit 23 composed of integrated circuit 24*a* and resistor 24*b*. Support 25*a* of shielded case 25 is inserted into through hole 67 and attached at the side of sub-sub board 52 with solder 69. At this moment, it is important to preliminarily form burr 25*b* facing the inside (at the side of sub-sub board 52) at the distal end of support 25*a*. This is because solder 69 is filled in the clearance formed between burr 25*b* and the wall surface of through hole 67 owing to capillary tube phenomenon. This enables shielded case 25 to be securely attached to sub-sub board 52.

When sub-sub board 52 thus formed is divided at hole 65, a communication module in the unit of circuit board 21, namely a single communication module shown in FIG. 1, is completed.

Figure 13:
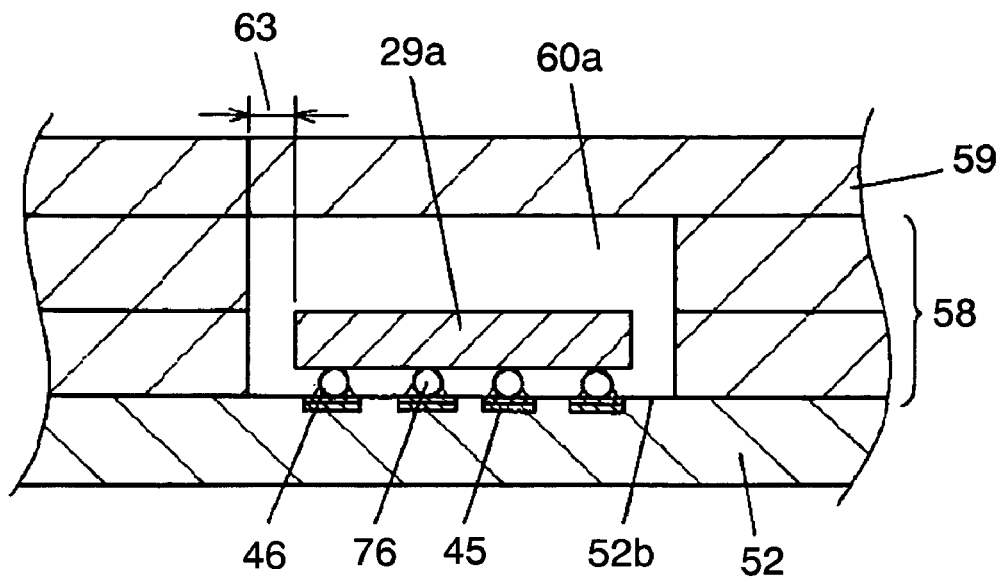
FIG. 13 is a sectional view of the substantial part of the process for manufacturing the communication module according to the first exemplary embodiment, before thermocompression bonding.

FIG. 13 is a sectional view of the substantial part before thermocompression bonding. In FIG. 13, the number of unhardened sheets 58 is simplified for convenience in the drawings and description. The tuner unit and demodulating unit are not illustrated specifically, but integrated circuit 29*a* represents them.

On second main surface 52*b* of sub-sub board 52, integrated circuit 29*a* is connected to land pattern 45 with solder 46. Second main surface 52*b* of sub-sub board 52 has unhardened sheets 58, 59 laminated that are porous glass fiber with resin impregnated and have a thermosetting property.

Unhardened sheets 58, 59 have a plate-like shape that is woven or nonwoven textile with heat-flowable resin impregnated, and are unhardened component-containing sheets provided with hole (opening) 60*a* having clearance 63 in which resin part 30 is formed where resin part 30 corresponds to the outer circumference of integrated circuit 29*a*. Hole 60*a* is an opening for housing electronic components. Integrated circuit 29*a* provided on sub-sub board 52 loosely inserted into hole 60*a* having clearance 63. Solder ball 76, provided as a terminal of integrated circuit 29*a*, is fastened to land pattern 45 provided on sub-sub board 52 with solder 46.

Figure 14:
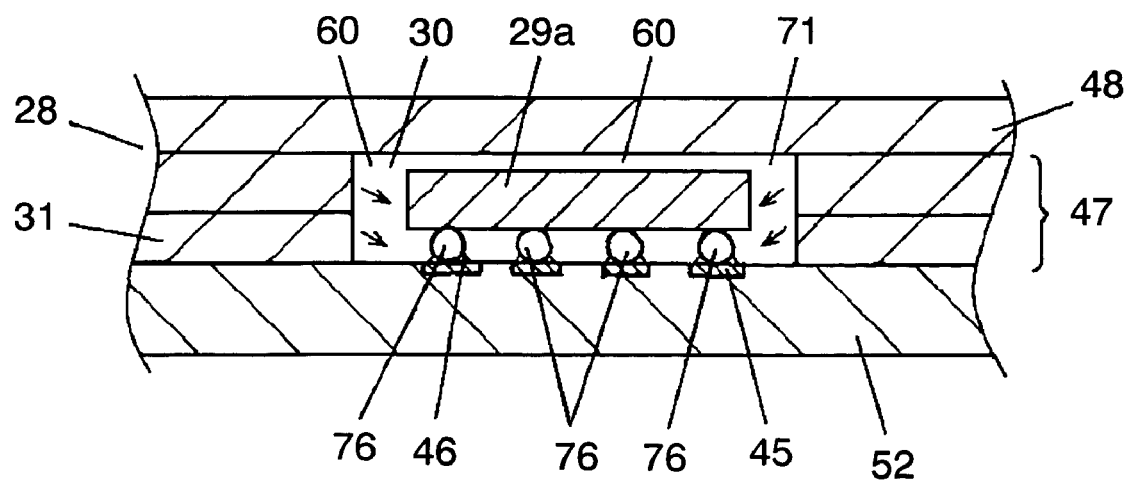
FIG. 14 is a sectional view of the substantial part of the process for manufacturing the communication module according to the first exemplary embodiment, after thermocompression bonding.

When thermocompressed and bonded in this state, unhardened sheets 58, 59 are compressed to approximately one third of their original sizes, to change to hardened sheets 47, 48 as shown in FIG. 14. That is, resin 71 contained in the porous fiber of unhardened sheets 58, 59 flows out to become hardened sheets 47, 48, thus forming base-material-containing resin part 31. Still, the entire clearance between hole 60 and integrated circuit 29*a* is filled with resin 71 to form resin part 30, and thus component-containing material 28 is formed with resin part 30 and base-material-containing resin part 31. Resin part 30 formed in this way causes air to be purged owing to resin 71 having flowed in, resulting in no air or the like being left in resin part 30. This prevents poor connection between the electrode of electronic component 29 and land pattern 45 due to thermal expansion of remaining air, thus improving electrical and mechanical reliability.

Unhardened sheets 58, 59 are of thermosetting resin that is not yet hardened, and thus they lose their plastic property even if heated again after being once thermally hardened and deformed to hardened sheets 47, 48 to become base-material-containing resin part 31. Consequently, integrated circuit 29*a* once sealed with resin 71 remains fixed.

Figure 15:
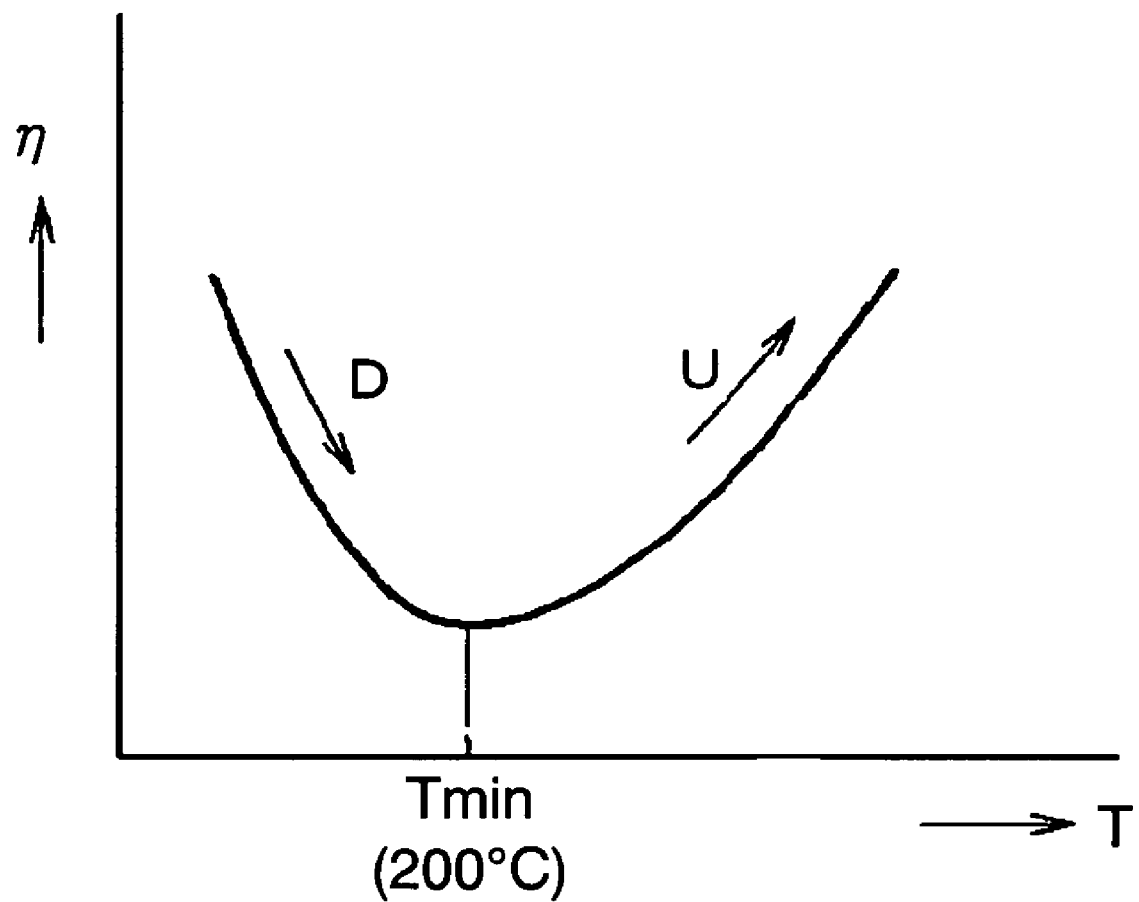
FIG. 15 is a characteristic diagram of resin viscosity in the process for manufacturing the communication module according to the first exemplary embodiment.

FIG. 15 is a characteristic diagram of viscosity $\eta$ of the resin in the process of manufacturing the communication module according to the first exemplary embodiment, where the horizontal and vertical axes indicate temperature T and viscosity $\eta$, respectively. As shown in FIG. 15, viscosity $\eta$ of resin 71 gradually decreases as the ambient temperature increases through temperature Tmin (approximately 200° C.) as shown by direction D. As viscosity $\eta$ decreases, the fluidity of resin 71 increases to be adequately filled in a narrow clearance, thus preventing air from undesirably remaining in a clearance. After exceeding temperature Tmin, viscosity $\eta$ gradually increases as shown by direction U to harden resin 71 gradually.

In this thermocompression bonding, it is important to preliminarily adjust the ambient temperature of solder 46 to a temperature lower than the melting point of solder 46. That is, solder 46 is preferably used that has a melting point higher than the ambient temperature at thermocompression bonding. This is because the following problem occurs. That is, when the ambient temperature rises and the internal temperature of solder 46 exceeds its melting point (approximately 200° C.), solder 46 melts and mixes with resin 71 to cause a short between solder ball 76 in integrated circuit 29*a* and other solder ball 76. To prevent this problem, solder with a high melting point is used for solder 46.

Here, the present invention according to the first exemplary embodiment is outlined using the reference marks as follows. That is, the communication module according to the present invention is equipped with:

circuit board 21 having a first main surface, and a second main surface opposite to the first one;

first amplifier 37*a* arranged on the first main surface of circuit board 21, for amplifying a first signal;

first mixer 39*a* arranged on the first main surface of circuit board 21, for converting a signal supplied from first amplifier 37*a* to an intermediate-frequency (low-frequency) signal;

second amplifier 37*b* arranged on the second main surface of circuit board 21, for amplifying a second signal; and second mixer 39*b* arranged on second main surface of circuit board 21, for converting a signal supplied from second amplifier 37*b* to an intermediate-frequency (low-frequency) signal.

The first exemplary embodiment further discloses a method of manufacturing the communication module. That is, the embodiment lists the following steps:

a first attaching step for attaching second electronic component 29 including second amplifier 37b and second mixer 39b to the second main surface of circuit board 21 thermally hardened;

a laminating step for laminating component-containing sheets 58, 59 yet to be hardened, having opening 60a for housing second electronic component 29, and are unhardened, on the second main surface of circuit board 21, after the first attaching step;

an integrating step for integrating circuit board 21 and component-containing sheets 58, 59 by crimping them while heating them in a polymerized state, after the laminating step;

a second attaching step for attaching first electronic component 24 including first amplifier 37a and first mixer 39a, on the first main surface of circuit board 21, after the integrating step; and a shielded case attaching step for attaching metal shielded case 25 so as to cover first electronic component 24, after the second attaching step.

Second Exemplary Embodiment

The communication module of the second exemplary embodiment is different from that of the first exemplary embodiment in that first tuner unit 23, second tuner unit 26, and demodulating unit 27 are each attached to separate circuit boards.

Figure 16:
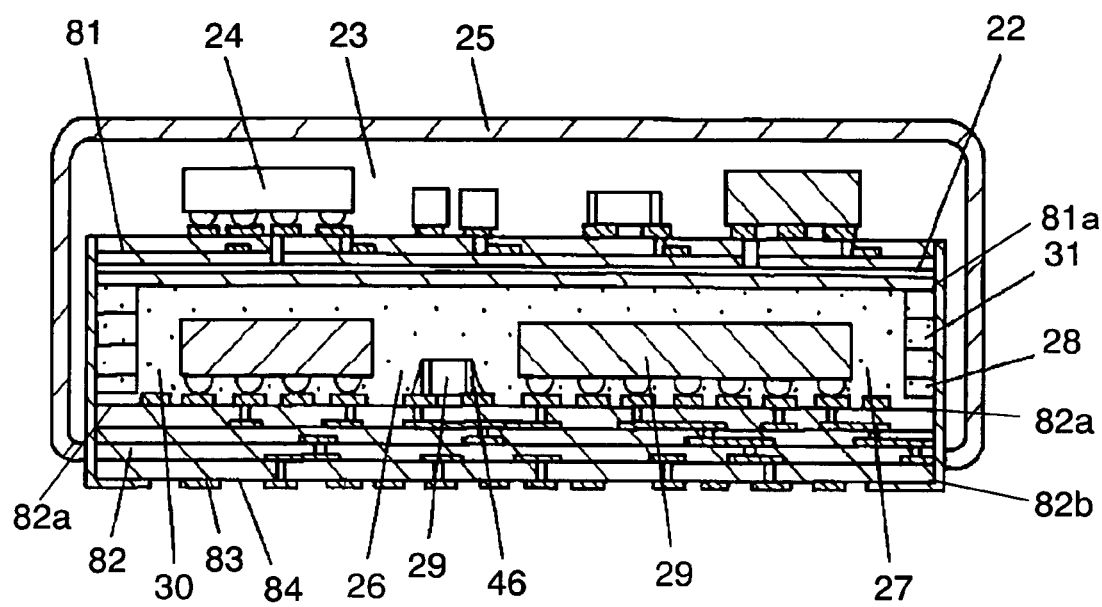
FIG. 16 is a sectional view of a communication module according to the second exemplary embodiment of the present invention.

That is, as shown in FIG. 16, the module is equipped with first circuit board 81 that has first tuner unit 23 attached thereon and has been hardened; and second circuit board 82 that has second tuner unit 26 and demodulating unit 27 attached thereon and has been hardened, and the module is provided with component-containing material 28 incorporating electronic components 29 between first main surface 81a of first circuit board 81 and first main surface 82a of second circuit board 82.

Here, electrode 83 is led from first circuit board 81 or second circuit board 82 to bottom surface 84 of the communication module through a through hole. Ground plane 22 is provided in the inner layer of first circuit board 81.

The respective electrodes provided on first main surface 82a of second circuit board 82 with tuner unit 26 and demodulating unit 27 attached thereon are linked to electrodes 83 formed on second main surface 82b, namely bottom surface 84, through through holes or inner vias, and thus their lengths become short to improve the high-frequency characteristic.

Inserting ground plane 22 into the inner layer of second circuit board 82 improves the degree of high-frequency separation and isolation between this communication module and the main board on which the communication module is implemented. Forming components other than electrode 83 provided on second main surface 82b of second circuit board 82, with an insulating body enables the wiring pattern of the main board to be provided under the communication module. This improves the flexibility of the wiring pattern in the main board on which the communication module is implemented. The other features are the same as those in the first exemplary embodiment. A component that is the same as one in the first exemplary embodiment is given the same reference mark to simplify its description.

Figure 17:
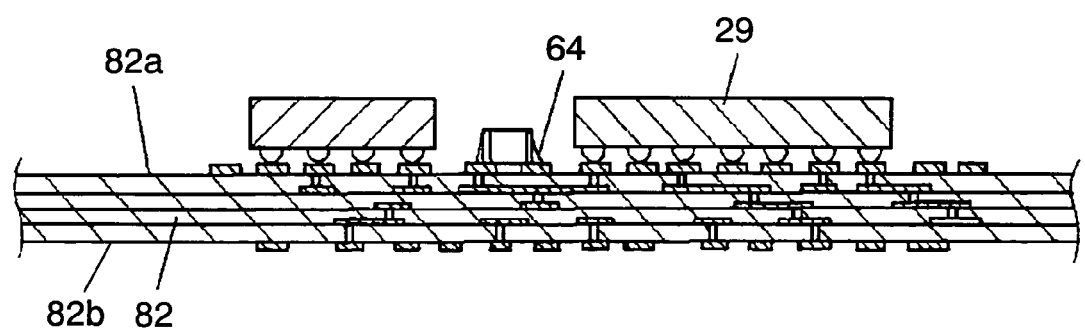
FIG. 17 is a sectional view illustrating the first step of the process for manufacturing the communication module according to the second exemplary embodiment.

FIGS. 17 through 21 illustrate respective steps for manufacturing a communication module according to the second exemplary embodiment of the present invention. Here, a description the same as one in the first exemplary embodiment is simplified. FIG. 17 indicates second circuit board 82 thermally hardened. Second circuit board 82, made of the same material as that of circuit board 21 shown in FIG. 1, is to have electronic component 29 fastened to first main surface 82a of second circuit board 82 with solder 64.

Figure 18:
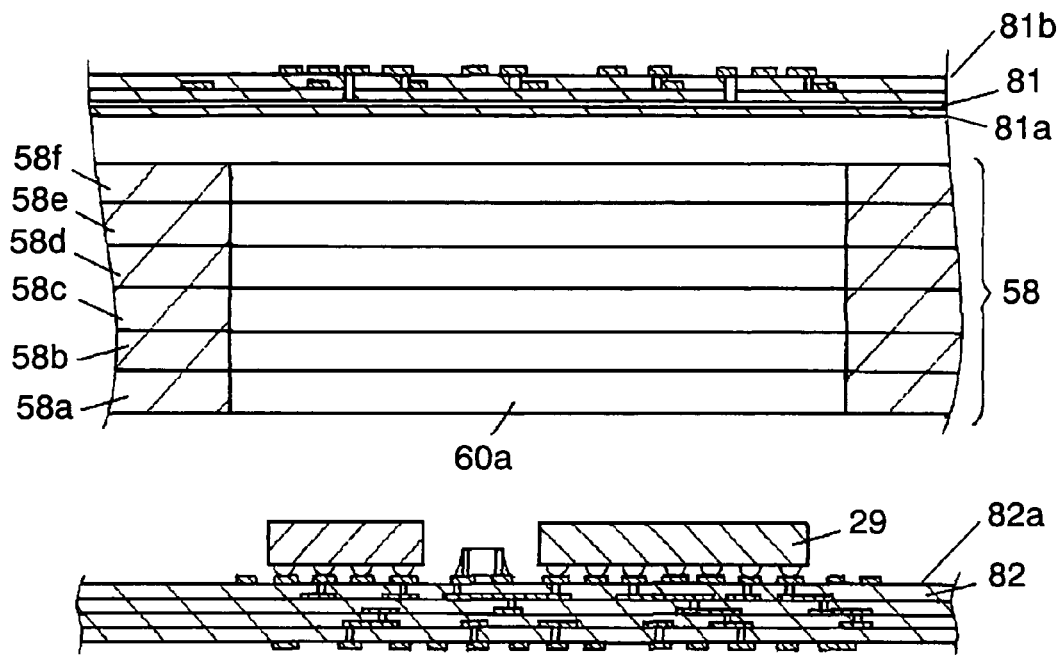
FIG. 18 is a sectional view illustrating the second step of the process for manufacturing the communication module according to the second exemplary embodiment.

Next, as shown in FIG. 18, unhardened sheet 58 is laminated on first main surface 82a of second circuit board 82 with electronic component 29 attached thereon, and then first circuit board 81 thermally hardened is further laminated over unhardened sheet 58. First circuit board 81 is made of the same material as that of circuit board 21.

Figure 19:
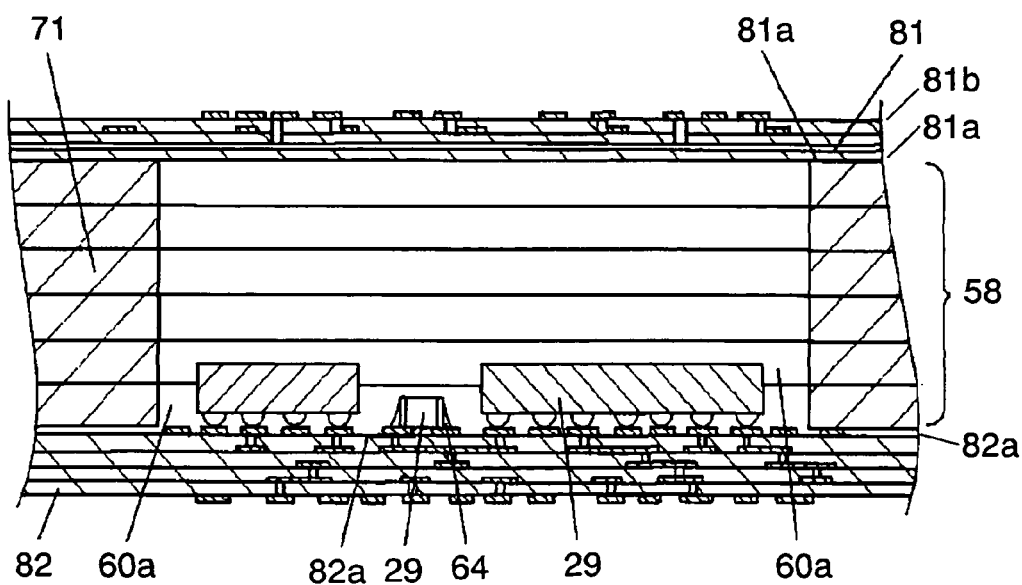
FIG. 19 is a sectional view illustrating the third step of the process for manufacturing the communication module according to the second exemplary embodiment.

Next, as shown in FIG. 19, unhardened sheet 58 is sandwiched between first main surface 81a of first circuit board 81 and first main surface 82a of circuit board 82, to be integrated. Then, thermocompression bonding is performed in the same conditions as those in the first exemplary embodiment.

Figure 20:
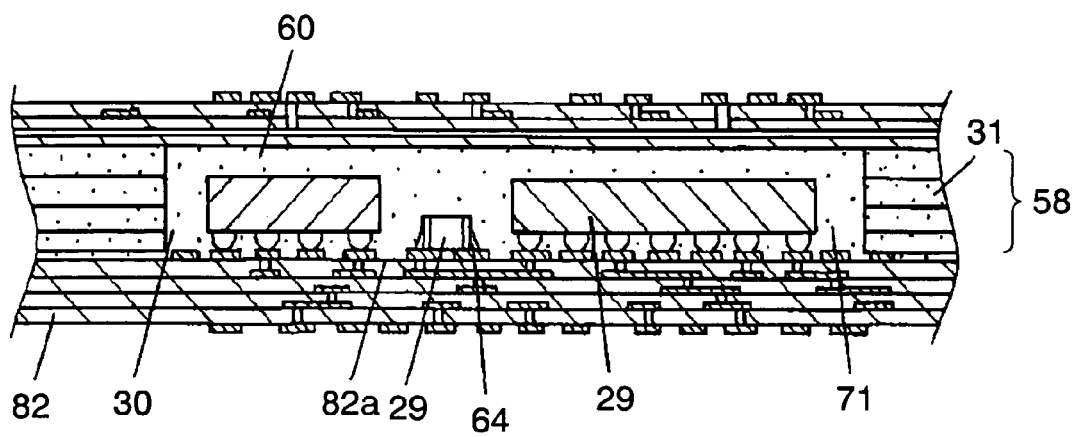
FIG. 20 is a sectional view illustrating the fourth step of the process for manufacturing the communication module according to the second exemplary embodiment.

Applying heat and pressure causes resin 71 in unhardened sheet 58 to flow into hole 60a and unhardened sheet 58 to be hardened to become base-material-containing resin part 31 as shown in FIG. 20. Still, resin 71 having flowed out forms resin part 30.

Figure 21:
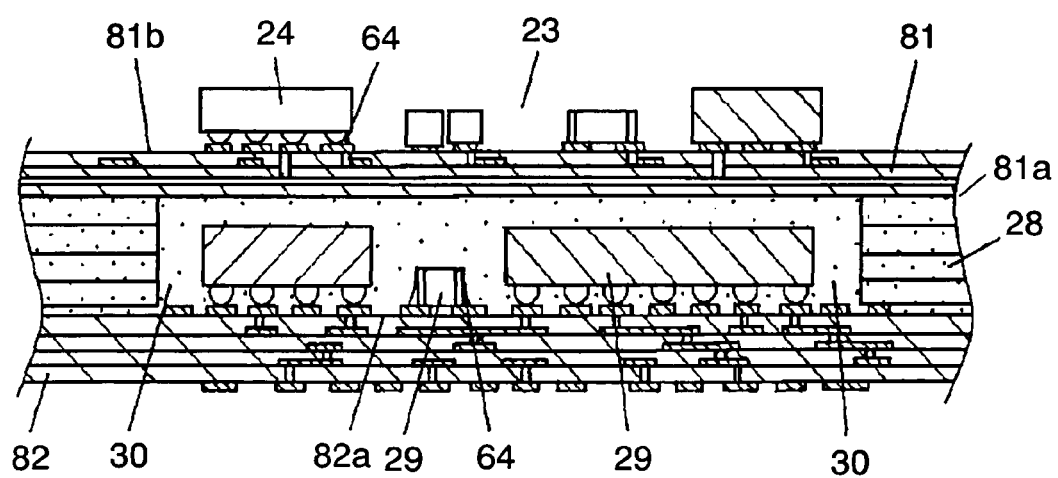
FIG. 21 is a sectional view illustrating the fifth step of the process for manufacturing the communication module according to the second exemplary embodiment.

Next, as shown in FIG. 21, electronic component 24 forming tuner unit 23 is fastened to second main surface 81b of first circuit board 81 with solder 64. Then, shielded case 25 (refer to FIG. 1) is attached so as to cover this electronic component 24. Next, they are divided to complete the communication module as shown in FIG. 16.

The communication module according to the present invention thus has first circuit board 81 and second circuit board 82 thermally hardened on the top and bottom surfaces of component-containing material 28. First circuit board 81 and second circuit board 82 have hardness against heat, thus preventing warpage prone to occur in a thermocompression bonding process. The other features are the same as those in the first exemplary embodiment.

Here, the makeup according to the second exemplary embodiment is summarized as follows. That is, another communication module according to the present invention is equipped with:

first circuit board 81 having first main surface 81a, and second main surface 81b opposite to first main surface 81a;

second circuit board 82 having first surface 82a, and second main surface 82b opposite to first surface 82a, and arranged so that second main surface 82b faces first main surface 81a of first circuit board 81;

first amplifier 37a arranged on second main surface 81b of first circuit board 81, for amplifying a first signal;

first mixer 39a arranged on second main surface 81b of first circuit board 81, for converting a signal supplied from first amplifier 37a to an intermediate-frequency signal;

second amplifier 37b arranged on first main surface 82a of second circuit board 82, for amplifying a second signal;

second mixer 39b arranged on first main surface 82a of second circuit board 82, for converting a signal supplied from second amplifier 37b to an intermediate-frequency signal; and resin part 30 arranged between first circuit board 81 and second circuit board 82, for covering second amplifier 37b and second mixer 3b.

The second exemplary embodiment further discloses another method of manufacturing the communication module including:

a first attaching step for attaching second electronic component 29 including second amplifier 37b and second mixer 39b, to first main surface 82a of second circuit board 82 thermally hardened;

a laminating step for laminating component-containing sheets 58, 59 yet to be hardened, having opening 60a for housing second electronic component 29 between first main surface 81a of first circuit board 81 and first main surface 82a of second circuit board 82, after the first attaching step;

an integrating step for integrating first circuit board 81, component-containing sheets 58, 59, and second circuit board 82 by crimping them while heating them in a polymerized state, after the laminating step;

a second attaching step for attaching first electronic component 24 including first amplifier 37a and first mixer 39a, to second main surface 81b of first circuit board 81, after the integrating step; and a shielded case attaching step for attaching metal shielded case 25 to first main surface 81b of first circuit board 81 so as to cover first electronic component 24, after the second attaching step.

Third Exemplary Embodiment

The communication module of the third exemplary embodiment is that shown in the first exemplary embodiment, where first terminal 35a and second terminal 35b are formed near a pair of opposing corners of circuit board 21. Local oscillators 38a and 38b are commoditized. This makeup prevents first tuner unit 102 and second tuner unit 103 from undesirably interfering with each other due to their high-frequency signals, while reducing power consumption. Here, a component that is the same as one in the first exemplary embodiment is given the same reference mark to simplify its description.

Figure 22:
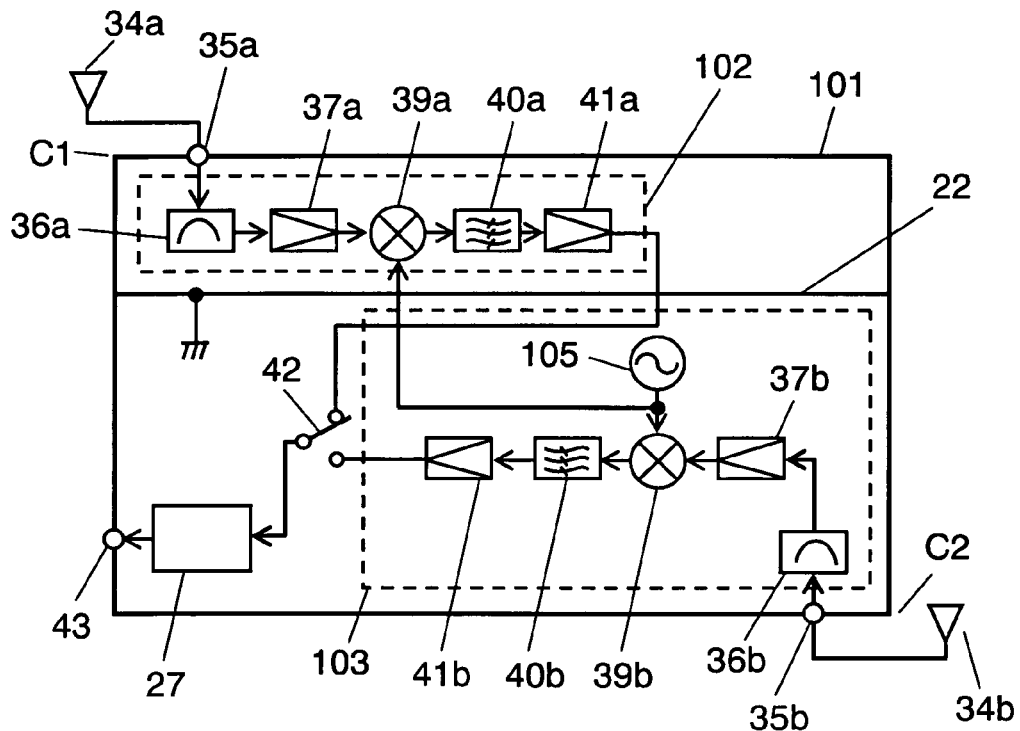
FIG. 22 is a block diagram of a communication module according to the third exemplary embodiment of the present invention.

FIG. 22 illustrates circuit board 101 corresponding to circuit board 21 in the first exemplary embodiment. Circuit board 101 is the same as circuit board 21 in their material and method of manufacturing. The first main surface of circuit board 101 has first tuner unit 102 (corresponding to tuner unit 23 in the first exemplary embodiment) implemented thereon. The second main surface of circuit board 101 has second tuner unit 103 (corresponding to tuner unit 26 in the first exemplary embodiment), electronic switch 42, and demodulating unit 27, all implemented thereon.

Here, first terminal 35a of tuner unit 102 is provided near corner C1 of the first main surface of circuit board 101. Second terminal 35b of second tuner unit 103 is provided near corner C2 of the second main surface of circuit board 101. That is, first terminal 35a and second terminal 35b are provided near a pair of opposing corners of circuit board 101. Such spatial distance further improves the degree of high-frequency separation and isolation compared to the first exemplary embodiment. More specifically, in circuit board 104 for an experiment shown in FIG. 23, it is proved that the degree of separation and isolation has been improved by 35.6 dB (85.6 dB−50.0 dB) when first terminal 35a and second terminal 35b are provided at position P1 and position P11, respectively, compared to a conventional case provided at position P2, as shown in Table 1.

TABLE 1

| Position P | Distance X (mm) | Distance Y (mm) | Separation/ isolation degree S1 (470 MHz) | Separation/ isolation degree S2 (770 MHz) |
|---|---|---|---|---|
| P1 | −3.6 | −5.0 | — | — |
| P2 | −2.4 | −5.0 | −54.3 | −50.0 |
| P3 | −1.2 | −5.0 | −78.0 | −72.3 |
| P4 | 0.0 | −5.0 | −82.9 | −77.0 |
| P5 | 1.2 | −5.0 | −84.7 | −79.3 |
| P6 | 2.4 | −5.0 | −85.6 | −80.5 |
| P7 | 3.6 | −5.0 | −86.1 | −81.2 |
| P8 | 5.0 | −2.4 | −87.6 | −84.1 |
| P9 | 5.0 | 0.0 | −87.9 | −85.1 |
| P10 | 5.0 | 2.4 | −88.6 | −86.0 |
| P11 | 3.6 | 5.0 | −88.5 | −85.6 |
| P12 | 0.0 | 5.0 | −88.2 | −85.8 |
| P13 | 3.6 | 5.0 | −87.7 | −84.4 |
| P14 | −5.0 | 2.4 | −86.7 | −82.5 |
| P15 | −5.0 | 0.0 | −84.5 | −79.9 |
| P16 | −5.0 | 2.4 | −82.6 | −76.6 |

Figure 23:
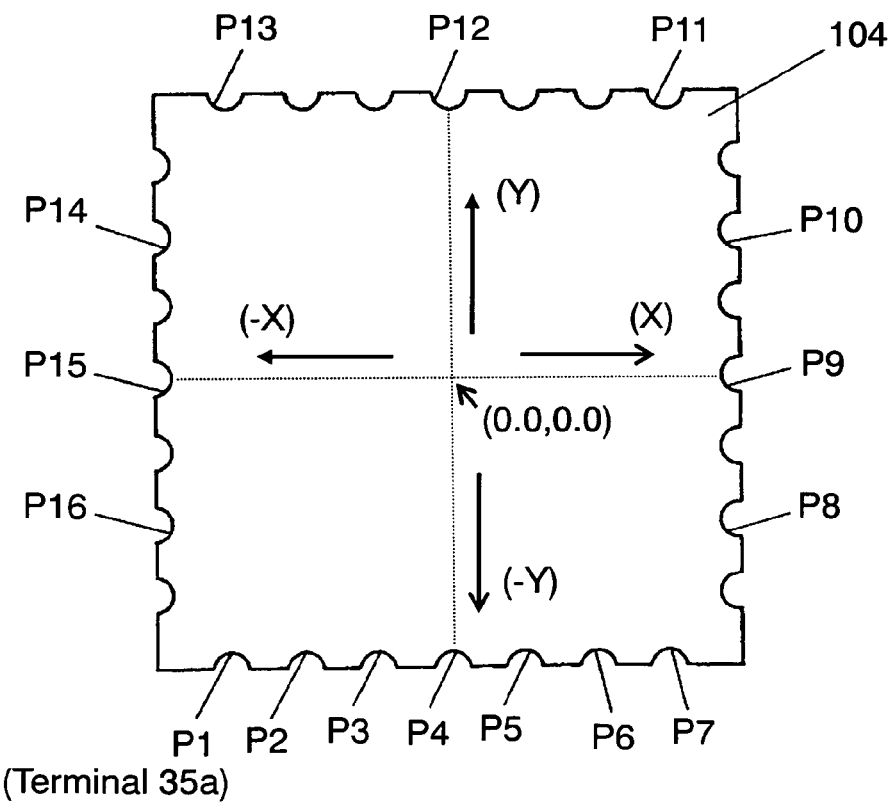
FIG. 23 is a plan view of a performance evaluating circuit board of the communication module according to the third exemplary embodiment of the present invention.
Figure 24:
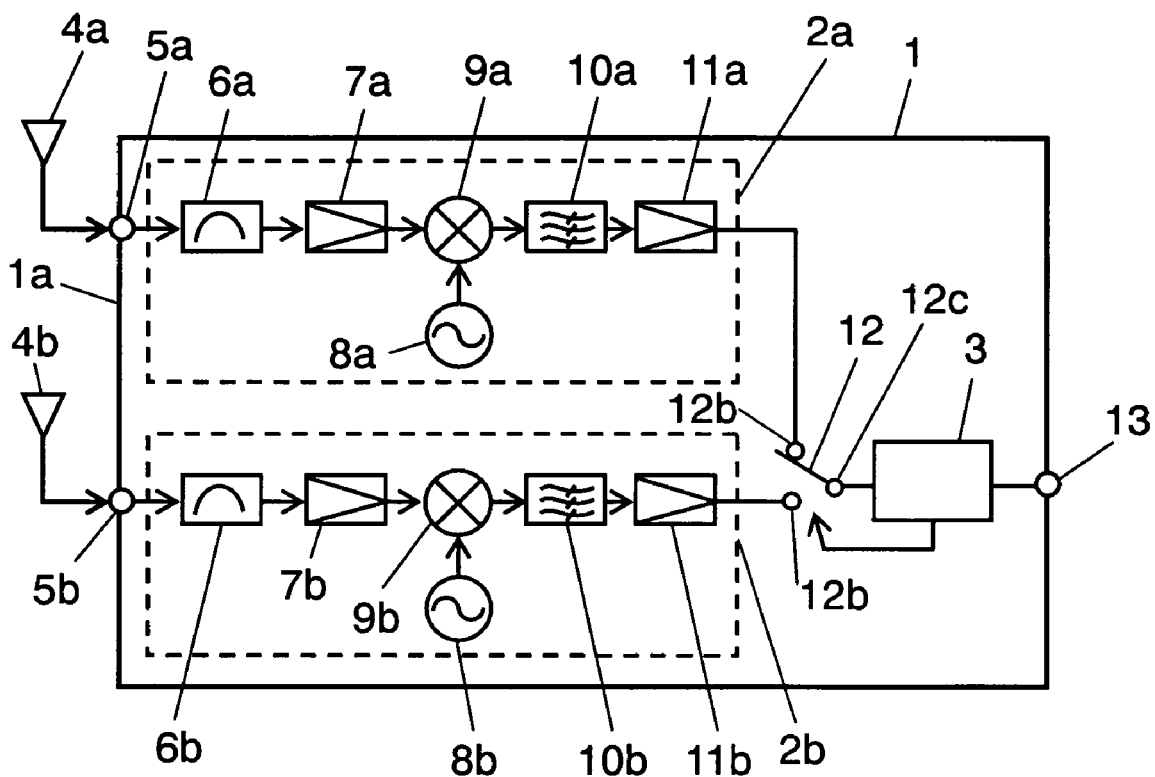
FIG. 24 is a block diagram of a conventional communication module.

In Table 1, positions P1 through P16 correspond to those shown in FIG. 23. Position P1 indicates the position of first terminal 35a. Positions P2 through P16 indicate the position of second terminal 35b (refer to FIG. 23). Distance X shows the distance in direction X from center point Q0 of circuit board 104, where the positive and negative signs indicate the direction toward position P9 and that toward position P15, respectively. For distance Y, in the same way, the positive and negative signs indicate the direction toward position P12 and that toward position P4, respectively.

Circuit board 104 for an experiment has size: 10 mm×10 mm, material: FR4 (flame retardant type 4, relative permittivity: 4.7), 4-layer board, thickness: 0.5 mm, terminal pitch: 1.2 mm.

Thus, the center of position P1 is indicated as X: −3.6 mm and Y: −5.0 mm. Position P11, provided symmetrically at the opposing corner of position P1 and thus its polarity inverted, is indicated as X: 3.6 mm and Y: 5.0 mm. Positions P4 and P12 are indicated as distance X: 0, and distance Y: −5.0 mm and 5.0 mm, respectively. In the same way, positions P9 and P15 are indicated as distance X: 5.0 mm and −5.0 mm, respectively, and distance Y: 0.

In Table 1, separation/isolation degree S1 indicates the degree when the frequency of an input signal fed into first terminal 35a and second terminal 35b is 470 MHz. That is, degree S1 indicates the strength of a signal generated at second input terminal 35b when a 470 MHz input signal is fed into the first input terminal, namely the ratio of how much interference is removed. In the same way, separation/isolation degree S2 indicates the strength when the frequency of an input signal is 770 MHz.

Here, in the same way as in the first exemplary embodiment, an improvement of 34.4 dB (84.4 dB−50.0 dB) is made for lateral sides P2 and P13 facing each other.

Local oscillator 105 in the third exemplary embodiment is provided in tuner unit 103 formed on the second main surface of circuit board 101. Local oscillator 105 is connected to the other input of second mixer 39b in tuner unit 103 and to the other input of first mixer 39a of tuner unit 102 as well. That is, they are commoditized.

This allows local oscillator 105 to be formed in a single stage, thus suppressing an output signal of an interfering wave while reducing power consumption. Further, circuit board 101, ground pattern 22, and shielded case 25 enable high-frequency separation and isolation from the outside. Here, the ground of local oscillator 105 is connected directly to support 25a of shielded case 25 with a wiring pattern, and thus the grounding of local oscillator 105 is enhanced to suppress output of a disturbing signal. Such an effect is extremely useful for a communication module because such a tuner incorporated in a mobile phone and the like in recent years is able to suppress interference with the mobile phone.

Here, the makeup according to the third exemplary embodiment is summarized as follows. That is, another communication module according to the present invention has first terminal 35a arranged near the corner of circuit boards 21, 101, each having a substantially quadrangle shape, for supplying a first signal to first filter 36a; and second terminal 35b arranged near the opposing corner of the corner of circuit board 21, for supplying a second signal to second filter 36b.

A communication module of the present invention improves the separation and isolation characteristic in high frequencies between the first and second tuner units, can be used for a diversity receiver and the like, and thus has wide industrial applicability.

The invention claimed is:

1. A communication module comprising:
  a circuit board having a first main surface, and a second main surface opposite to the first main surface;
  a first amplifier arranged on the first main surface, for amplifying a first signal;
  a first mixer arranged on the first main surface, for reducing frequency of a signal supplied from the first amplifier;
  a second amplifier arranged on the second main surface, for amplifying a second signal;
  a second mixer arranged on the second main surface, for reducing frequency of a signal supplied from the second amplifier; and
  a local oscillator arranged on the second main surface, electrically connected to the first mixer and the second mixer.

2. The communication module of claim 1, further comprising a conductive ground plane arranged in an inner layer of the circuit board.

3. The communication module of claim 1, further comprising a resin part arranged on the second main surface, for covering the second amplifier and the second mixer.

4. The communication module of claim 3, further comprising:
  a first filter arranged on the first main surface, for outputting the first signal to the first amplifier; and
  a second filter arranged on the second main surface, for outputting the second signal to the second amplifier.

5. The communication module of claim 4, wherein the circuit board has a quadrangle shape and further comprises:
  a first terminal arranged near a first corner of the circuit board, for inputting the first signal to the first filter; and
  a second terminal arranged near an opposing corner of the first corner, for inputting the second signal to the second filter.

6. A communication module comprising:
  a circuit board having a first main surface, and a second main surface opposite to the first main surface;
  a first amplifier arranged on the first main surface, for amplifying a first signal;
  a first mixer arranged on the first main surface, for reducing frequency of a signal supplied from the first amplifier;
  a second amplifier arranged on the second main surface, for amplifying a second signal;
  a second mixer arranged on the second main surface, for reducing frequency of a signal supplied from the second amplifier; and
  a demodulating unit arranged on the second main surface, supplied with a signal from the first mixer and a signal from the second mixer.

7. A communication module comprising:
  a first circuit board having a first main surface, and a second main surface on a side opposite to the first main surface;
  a second circuit board which first main surface is arranged facing a side facing the first main surface of the first circuit board;
  a first amplifier and a first mixer arranged on the second main surface of the first circuit board, for amplifying a first signal;
  a second amplifier and a second mixer arranged on the first main surface of the second circuit board, for amplifying a second signal; and
  a resin part arranged between the first main surface of the first circuit board and the first main surface of the second circuit board, for covering the second amplifier and the second mixer.

8. A method of manufacturing a communication module, comprising:
  first attaching a first electronic component including a first amplifier and a first mixer to a first main surface of a circuit board thermally hardened;
  laminating a component-containing sheet yet to be hardened, having an opening for housing the first electronic component, on the first main surface of the circuit board, after the first attaching;
  integrating the circuit board and the component-containing sheet by crimping them while heating them in a polymerized state;
  second attaching a second electronic component, other than the first electronic component, including a second amplifier and a second mixer, other than the first amplifier and the first mixer, on a second main surface of the circuit board;
  attaching a metal shielded case so as to cover the second electronic component, after the second attaching.

9. A method of manufacturing a communication module, comprising:
  first attaching a first electronic component including an amplifier and a mixer to a first main surface of a first circuit board thermally hardened;
  laminating a component-containing sheet yet to be hardened, having an opening for housing the first electronic component, between the first main surface of the first circuit board and a first main surface of a second circuit board, other than the first circuit board, after the first attaching;
  integrating the first circuit board, the component-containing sheet, and the second circuit board, other than the first circuit board, by crimping them while heating them in a polymerized state;
  second attaching a second electronic component, other than the first electronic component, including an amplifier and a mixer, on a second main surface of the second circuit board; and
  attaching a metal shielded case to the second main surface of the second circuit board so as to cover the second electronic component, after the second attaching.

* * * * *